US011158553B2

(12) United States Patent
Wakazono

(10) Patent No.: US 11,158,553 B2
(45) Date of Patent: Oct. 26, 2021

(54) PACKAGE AND SEMICONDUCTOR DEVICE

(71) Applicant: NGK Insulators, Ltd., Nagoya (JP)

(72) Inventor: Yoshitsugu Wakazono, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/856,417

(22) Filed: Apr. 23, 2020

(65) Prior Publication Data
US 2020/0251393 A1 Aug. 6, 2020

Related U.S. Application Data

(63) Continuation of application No. PCT/JP2017/040854, filed on Nov. 14, 2017.

(51) Int. Cl.
*H01L 23/047* (2006.01)
*H01L 23/64* (2006.01)
*H01L 23/00* (2006.01)

(52) U.S. Cl.
CPC ............ *H01L 23/047* (2013.01); *H01L 23/64* (2013.01); *H01L 24/48* (2013.01); *H01L 2223/6655* (2013.01); *H01L 2224/48157* (2013.01); *H01L 2924/30111* (2013.01)

(58) Field of Classification Search
CPC ....... H01L 23/047; H01L 23/64; H01L 24/48; H01L 2223/6655; H01L 2224/48157; H01L 2924/30111
See application file for complete search history.

(56) References Cited

U.S. PATENT DOCUMENTS

| | | | |
|---|---|---|---|
| 9,922,894 B1 * | 3/2018 | Viswanathan | ........ H01L 23/047 |
| 2012/0032190 A1 | 2/2012 | Takagi | |
| 2014/0146506 A1 | 5/2014 | Miwa et al. | |
| 2016/0373085 A1 | 12/2016 | Barbieri et al. | |

FOREIGN PATENT DOCUMENTS

| | | |
|---|---|---|
| JP | S63-257255 A1 | 10/1988 |
| JP | 2000-312103 A1 | 11/2000 |
| JP | 2004-311568 A1 | 11/2004 |
| JP | 2014-107398 A1 | 6/2014 |

OTHER PUBLICATIONS

English translation of International Preliminary Report on Patentability (Application No. PCT/JP2017/040854) dated May 28, 2020.
International Search Report and Written Opinion (Application No. PCT/JP2017/040854) dated Feb. 6, 2018.
Extended European Search Report (Application No. 17931880.3) dated Jun. 15, 2021.

* cited by examiner

*Primary Examiner* — Peniel M Gumedzoe
(74) *Attorney, Agent, or Firm* — Burr & Brown, PLLC

(57) ABSTRACT

A package includes a base substrate, a frame, and a lead frame. The base substrate is made of metal, and includes a mounting area on which a semiconductor element is to be mounted and a frame area surrounding the mounting area. The frame is provided on the frame area of the base substrate, and includes a first surface facing the frame area and a second surface opposite to the first surface. The lead frame is joined to the second surface of the frame. The frame includes a plurality of dielectric layers having a layered structure and an element connector to be electrically connected to the semiconductor element. The plurality of dielectric layers include a first dielectric layer having first permittivity and a second dielectric layer having second permittivity different from the first permittivity.

8 Claims, 4 Drawing Sheets

PACKAGE AND SEMICONDUCTOR DEVICE

TECHNICAL FIELD

The present invention relates to a package and a semiconductor device, and more particularly relates to a package including a lead frame and a semiconductor device including the package.

BACKGROUND ART

A semiconductor device such as a power amplifier often includes a semiconductor element and a package on which the semiconductor element is mounted. In the package, a plurality of lead frames are often provided. Each lead frame may have a function as an input terminal or an output terminal of the semiconductor device. The input terminal and the output terminal have input impedance and output impedance as characteristic impedance, respectively, and it is desirable that values thereof match that of an outside electrical system. In a typical example, the characteristic impedance of an electrical system is standardized to 50 ohms. When characteristic impedance of a semiconductor device is remarkably different from desired impedance, a matching circuit for adjusting the characteristic impedance is required. If the package itself has a function of a matching circuit, a matching circuit need not be externally attached to the package. Such a configuration can reduce the number of components. The configuration can also make it easier to reduce the entire size of a device including a matching circuit.

Technology described in Japanese Patent Application Laid-Open No. 2014-107398 (Patent Document 1) discloses a configuration of adding an impedance adjusting function to a feed-through portion of a high frequency device. Specifically, the high frequency device includes a base plate having a main surface, a dielectric, a signal line, an island pattern, a metal frame, a lead frame, a semiconductor chip, and a wire. The dielectric is formed on the main surface so as to extend along one side-surface of the base plate. The signal line is formed on the dielectric so as to extend from the one side-surface side to a central portion of the main surface. The island pattern extends from the one side-surface side to the central portion adjacently to the signal line on the dielectric, and is made of metal so as not to come in contact with the signal line. The metal frame includes a contact portion in contact with the main surface, and a bridge portion formed on an additional dielectric formed on a portion of the signal line and a portion of the island pattern so as to be formed above the signal line and the island pattern. The contact portion and the bridge portion entirely surround the central portion. The lead frame is connected to an outside signal line, which is a portion of the signal line located outside of the metal frame. The semiconductor chip is secured to the central portion. The wire connects the semiconductor chip and an inside signal line, which is a portion of the signal line surrounded by the metal frame.

PRIOR ART DOCUMENTS

Patent Documents

Patent Document 1: Japanese Patent Application Laid-Open No. 2014-107398

SUMMARY

Problem to be Solved by the Invention

The use of the technology described in the above patent publication alone allows for fine adjustment of characteristic impedance; however, it may be difficult to achieve sufficient impedance matching. Particularly when a semiconductor element having low output impedance of approximately 1 ohm is mounted, adjusting output impedance of a lead frame that outputs a signal from the semiconductor element to approximately 50 ohms is not easily achieved with the above-described technology, because significant impedance adjustment will be required.

The present invention is made in order to solve the problem as described above, and has an object to provide a package that allows for more sufficient impedance matching.

Means to Solve the Problem

A package according to one aspect of the present invention includes a base substrate, a frame, and a lead frame. The base substrate is made of metal, and includes a mounting area on which a semiconductor element is to be mounted and a frame area surrounding the mounting area. The frame is provided on the frame area of the base substrate, and includes a first surface facing the frame area and a second surface opposite to the first surface. The lead frame is joined to the second surface of the frame. The frame includes a plurality of dielectric layers having a layered structure and an element connector to be electrically connected to the semiconductor element. The plurality of dielectric layers include a first dielectric layer having first permittivity and a second dielectric layer having second permittivity different from the first permittivity.

A package according to another aspect of the present invention includes a base substrate, a frame, and a lead frame. The base substrate is made of metal, and includes a mounting area on which a semiconductor element is to be mounted and a frame area surrounding the mounting area. The frame is provided on the frame area of the base substrate, and includes a first surface facing the frame area and a second surface opposite to the first surface. The lead frame is joined to the second surface of the frame. The frame includes a plurality of dielectric layers having a layered structure and an element connector to be electrically connected to the semiconductor element. The element connector is electrically isolated from the lead frame on the second surface.

Effects of the Invention

In the package according to one aspect of the present invention, the frame of the package includes the first dielectric layer having first permittivity and the second dielectric layer having second permittivity different from the first permittivity. With this configuration, the degree of freedom in designing a configuration for performing impedance matching using the frame can be enhanced. Consequently, impedance matching using the frame of the package can be more sufficiently performed.

In the package according to another aspect of the present invention, the element connector is electrically isolated from the lead frame on the second surface. With this configuration, a matching circuit to be provided between the element connector and the lead frame is not limited to a circuit that is short-circuited on the second surface of the frame. Consequently, impedance matching using the frame can be more easily sufficiently performed.

DESCRIPTION OF EMBODIMENTS

An embodiment of the present invention will be described below with reference to the drawings.

Figure 1:
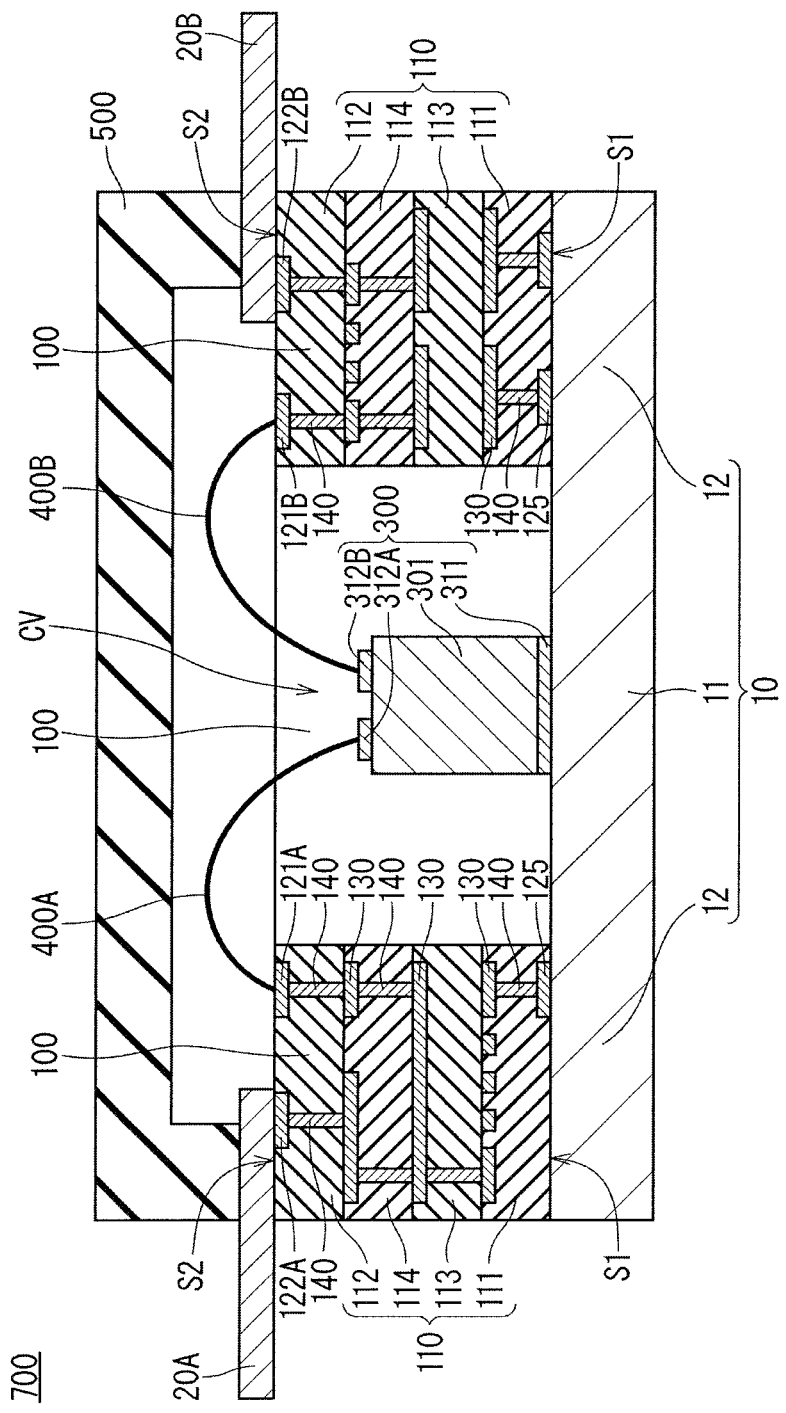
FIG. 1 is a cross-sectional view schematically illustrating a configuration of a semiconductor device according to an embodiment of the present invention, taken along the line I-I of FIG. 2.
Figure 2:
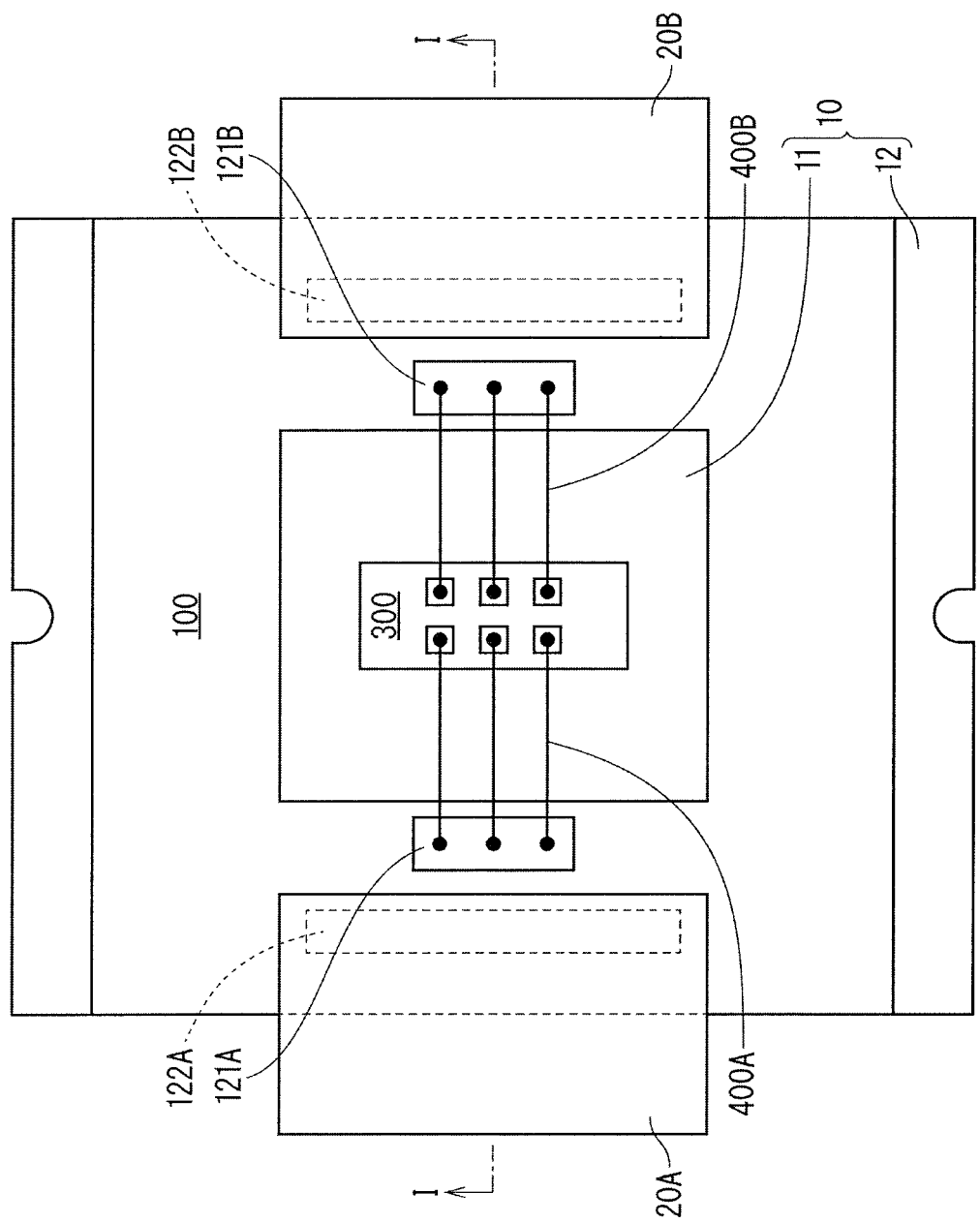
FIG. 2 is a plan view schematically illustrating the configuration of the semiconductor device according to the embodiment of the present invention, without a lid.

FIG. 1 is a cross-sectional view schematically illustrating a configuration of a semiconductor device 700 according to the present embodiment, taken along the line I-I of FIG. 2. FIG. 2 is a plan view schematically illustrating the configuration of the semiconductor device 700, without a lid 500.

The semiconductor device 700 includes a semiconductor element 300, wiring parts 400A and 400B, a lid 500, and a package. The package includes a base substrate 10, a frame 100, and lead frames 20A and 20B. The lid 500 is attached on the frame 100, thereby sealing a cavity CV (FIG. 1) that is surrounded by the frame 100. The lid 500 is made of an insulator. The lid 500 may be attached by using an adhesive, for example.

The base substrate 10 includes a mounting area 11 on which the semiconductor element 300 is to be mounted, and a frame area 12 surrounding the mounting area 11. The base substrate 10 is made of metal.

The semiconductor element 300 is mounted on the mounting area 11 of the base substrate 10. The semiconductor element 300 includes a semiconductor part 301, terminals 312A and 312B, and a back-surface electrode 311.

The lead frames 20A and 20B are joined to a frame upper surface S2 of the frame 100. The lead frames 20A and 20B project out of the frame 100 in the plan layout (view of FIG. 2). The lead frames 20A and 20B are made of metal.

The frame 100 is provided on the frame area 12 of the base substrate 10. The frame 100 includes a frame lower surface S1 (first surface) that faces the frame area 12 and a frame upper surface S2 (second surface that is opposite to the first surface). The frame 100 includes a plurality of dielectric layers 110 having a layered structure, element connectors 121A and 121B, at least one via electrode 140 (a plurality of via electrodes 140 in the example illustrated in FIG. 1), frame connectors 122A and 122B, at least one electrode layer 130 (a plurality of electrode layers 130 in the example illustrated in FIG. 1), and a base connector 125.

The element connectors 121A and 121B are provided on the frame upper surface S2. The element connectors 121A and 121B are made of metal. The element connectors 121A and 121B are electrically connected to the semiconductor element 300. The element connectors 121A and 121B are electrically isolated from the lead frames 20A and 20B on the frame upper surface S2.

In the example illustrated in FIG. 1, the plurality of dielectric layers 110 include a lower dielectric layer Ill, an upper dielectric layer 112, and intermediate dielectric layers 113 and 114. The lower dielectric layer 111 constitutes the frame lower surface S1 of the frame 100 either directly or through the base connector 125. The upper dielectric layer 112 constitutes the frame upper surface S2 of the frame 100 either directly or through an electrode structure. The electrode structure consists of the frame connectors 122A and 122B or the element connectors 121A and 121B. The intermediate dielectric layers 113 and 114 are interposed between the lower dielectric layer 111 and the upper dielectric layer 112.

The plurality of dielectric layers 110 include a first dielectric layer having first permittivity, and a second dielectric layer having second permittivity that is different from the first permittivity. Specifically, it is preferable that materials for the first dielectric layer and the second dielectric layer be any of the following five types.

Dielectric (1): BaO—$Al_2O_3$—$SiO_2$—$Bi_2O_3$ (k=7)
Dielectric (2): BaO—$TiO_2$—ZnO (k=27)
Dielectric (3): BaO—$Nd_2O_3$—$Bi_2O_3$—$TiO_2$ (k=81)
Dielectric (4): BaO—$R_2O_3$—$TiO_2$ (k=125)
Dielectric (5): High-k material (k≥1000)

Note that, in the above, the value k in parenthesis indicates typical relative permittivity. A dielectric for the first dielectric layer and a dielectric for the second dielectric layer are selected to be different from each other. Thus, it is preferable that at least one of the first and second dielectric layers be any one of the above dielectrics (1) to (4). The high-k material may be, for example, barium titanate or a barium titanate-based material. Selecting materials as described above can enable easy formation of the layered body of the dielectric layers 110 as low temperature co-fired ceramics (LTCC), with the electrode structure being provided inside.

The electrode layer 130 is interposed between the plurality of dielectric layers 110. The via electrode 140 penetrates at least one of the plurality of dielectric layers 110. One end of the via electrode 140 may be connected to the element connector 121A or 121B. Further, the via electrode 140 may be connected to the electrode layer 130. The via electrode 140 may be connected to the frame connector 122A or 122B. The base connector 125 is joined to the frame area 12 of the base substrate 10.

The frame connectors 122A and 122B are provided on the frame upper surface S2 of the frame 100. In other words, the frame connectors 122A and 122B are provided on the upper dielectric layer 112. The frame connectors 122A and 122B are made of metal. The frame connectors 122A and 122B are connected to the lead frames 20A and 20B, respectively. The element connectors 121A and 121B are electrically isolated from the lead frames 20A and 20B on the frame upper surface S2.

The wiring part 400A connects the element connector 121A of the frame 100 and the terminal 312A of the semiconductor element 300. The wiring part 400B connects the element connector 121B of the frame 100 and the terminal 312B of the semiconductor element 300. The wiring parts 400A and 400B are typically bonding wires.

Figure 3:
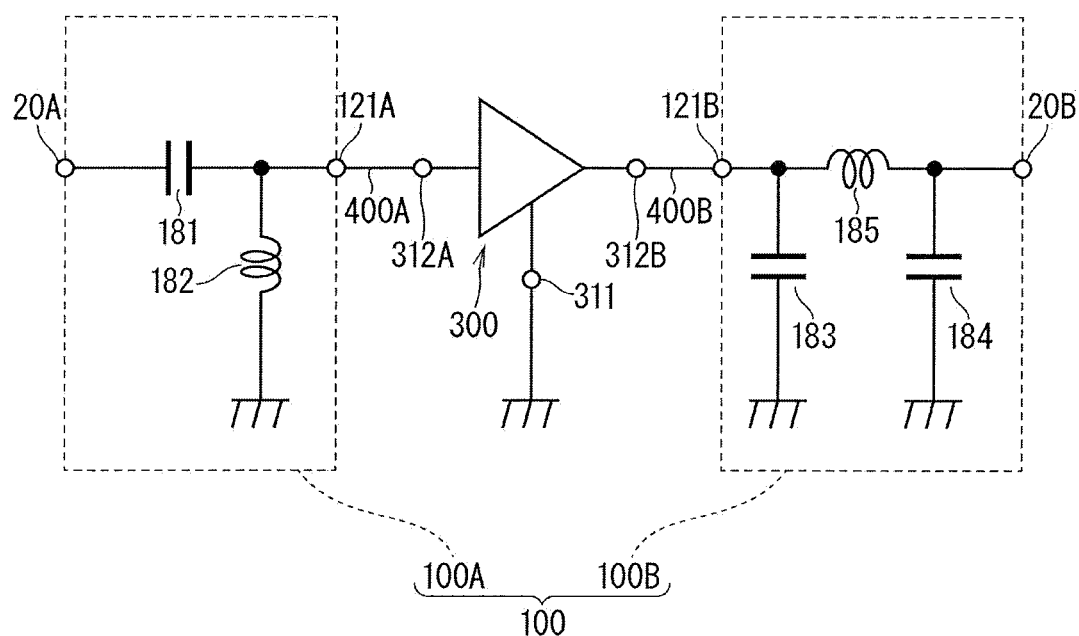
FIG. 3 is a circuit diagram illustrating an example of an equivalent circuit of the semiconductor device according to the embodiment of the present invention.

FIG. 3 is a circuit diagram illustrating an example of an equivalent circuit of the semiconductor device 700. In this example, the semiconductor device 700 is a power amplifying device including the lead frame 20A as an input terminal and the lead frame 20B as an output terminal. An input matching circuit 100A and an output matching circuit 100B are configured using the frame 100 in order to optimize input impedance and output impedance, respectively.

As illustrated in the figure, the input matching circuit 100A includes a capacitor 181 and an inductor 182. The output matching circuit 100B includes capacitors 183 and 184 an inductor 185. These capacitors and inductors are mainly configured by the frame 100. However, the lead frames 20A and 20B, the base substrate 10, and the wiring parts 400A and 400B may contribute to the configuration. According to the frame 100 of the present embodiment, the illustrated equivalent circuit can be easily achieved, in comparison with a case where a frame having only a simpler internal structure is used.

Note that an inductor having high-Q can be formed by using a dielectric layer made of the above dielectric (1). Further, a capacitor having high capacitance per unit area can be formed by using at least one of the above dielectrics (3) to (5). Further, the type of dielectrics may be selected in terms of securing a breakdown voltage.

Further, in this example, the semiconductor element 300 is a power amplifying element including the terminal 312A as an input terminal, the terminal 312B as an output terminal, and the back-surface electrode 311 as a ground terminal. The terminal 312B may output an electric signal from the semiconductor element 300 with characteristic impedance of 5 ohms or less. Even in such a case, the lead frame 20B can output the electric signal with characteristic impedance of standard 50 ohms by using the output matching circuit 100B. Note that, even when output impedance of standard 50 ohms is expected, a certain degree of impedance tolerance is usually permitted, for example, a tolerance of approximately 5 ohms is permitted. In a similar manner, the lead frame 20A can receive an electric signal to be output to the semiconductor element 300 with characteristic impedance of standard 50 ohms by using the input matching circuit 100A.

(Effect)

According to the present embodiment, the frame 100 of the package includes the first dielectric layer having first permittivity and the second dielectric layer having second permittivity different from the first permittivity. With this configuration, the degree of freedom in designing a configuration for performing impedance matching using the frame can be enhanced. Consequently, impedance matching using the frame of the package can be more sufficiently performed. For example, the size of the frame 100 can be reduced by using a dielectric having high permittivity in an area in which a capacitor having high capacitance is formed. In this case, a dielectric having lower permittivity may be used in an area that requires a high breakdown voltage in terms of prioritizing insulation reliability.

The element connectors 121A and 121B of the frame 100 are electrically isolated from the lead frames 20A and 20B on the frame upper surface S2. With this configuration, a matching circuit to be provided between the element connector 121A or 121B and the lead frame 20A or 20B is not limited to a circuit that is short-circuited on the frame upper surface S2. Consequently, impedance matching using the frame 100 of the package can be more easily sufficiently performed. Such a circuit as the output matching circuit 100B (FIG. 3), in particular, can be more easily configured.

The frame 100 includes at least one via electrode 140 penetrating at least one of the plurality of dielectric layers 110. With this configuration, the degree of freedom in designing a configuration for performing impedance matching using the frame 100 can be enhanced. Consequently, impedance matching using the frame of the package can be more sufficiently performed.

The at least one via electrode 140 includes a via electrode 140 connected to the element connector 121A or 121B of the frame 100. With this configuration, the degree of freedom in designing a configuration for performing impedance matching using the frame 100 can be enhanced. Consequently, impedance matching using the frame of the package can be more sufficiently performed. The via electrode 140 includes a via electrode 140 connected to the frame connector 122A or 122B. With this configuration, an electrical path made of metal can be provided from the lead frame 20A or 20B into the layered body of the dielectric layers 110.

The frame 100 includes at least one electrode layer 130 interposed between the plurality of dielectric layers 110. With this configuration, the degree of freedom in designing a configuration for performing impedance matching using the frame 100 can be enhanced. Consequently, impedance matching using the frame of the package can be more sufficiently performed.

The terminals 312A and 312B of the semiconductor element 300 often output an electric signal from the semiconductor element 300 with characteristic impedance of 5 ohms or less. When the package according to the present embodiment functions as the output matching circuit 100B (FIG. 3), the lead frame 20B can output the electric signal with characteristic impedance of 50 ohms. This enables output with standard output impedance of 50 ohms without externally attaching an additional matching circuit to the semiconductor device 700.

(Modifications)

The configuration of the frame 100 may be appropriately modified according to required impedance matching. Specifically, all of the plurality of dielectric layers 110 may have the same permittivity. The element connectors 121A and 121B need not be electrically isolated from the lead frames 20A and 20B on the frame upper surface S2. The via electrode 140 may be omitted. Each via electrode 140 may be separated from the element connectors 121A and 121B of the frame 100. The frame connectors 122A and 122B may be omitted. Each via electrode 140 may be separated from the frame connectors 122A and 122B. The electrode layer 130 may be omitted. The base connector 125 may be omitted. Although the number of the plurality of dielectric layers 110 is four in FIG. 1, the number may be any number of two or greater. When the number of the plurality of dielectric layers 110 is two, the intermediate dielectric layer is omitted. Note that another circuit may further be configured in addition to the matching circuit by the frame 100.

Figure 4:
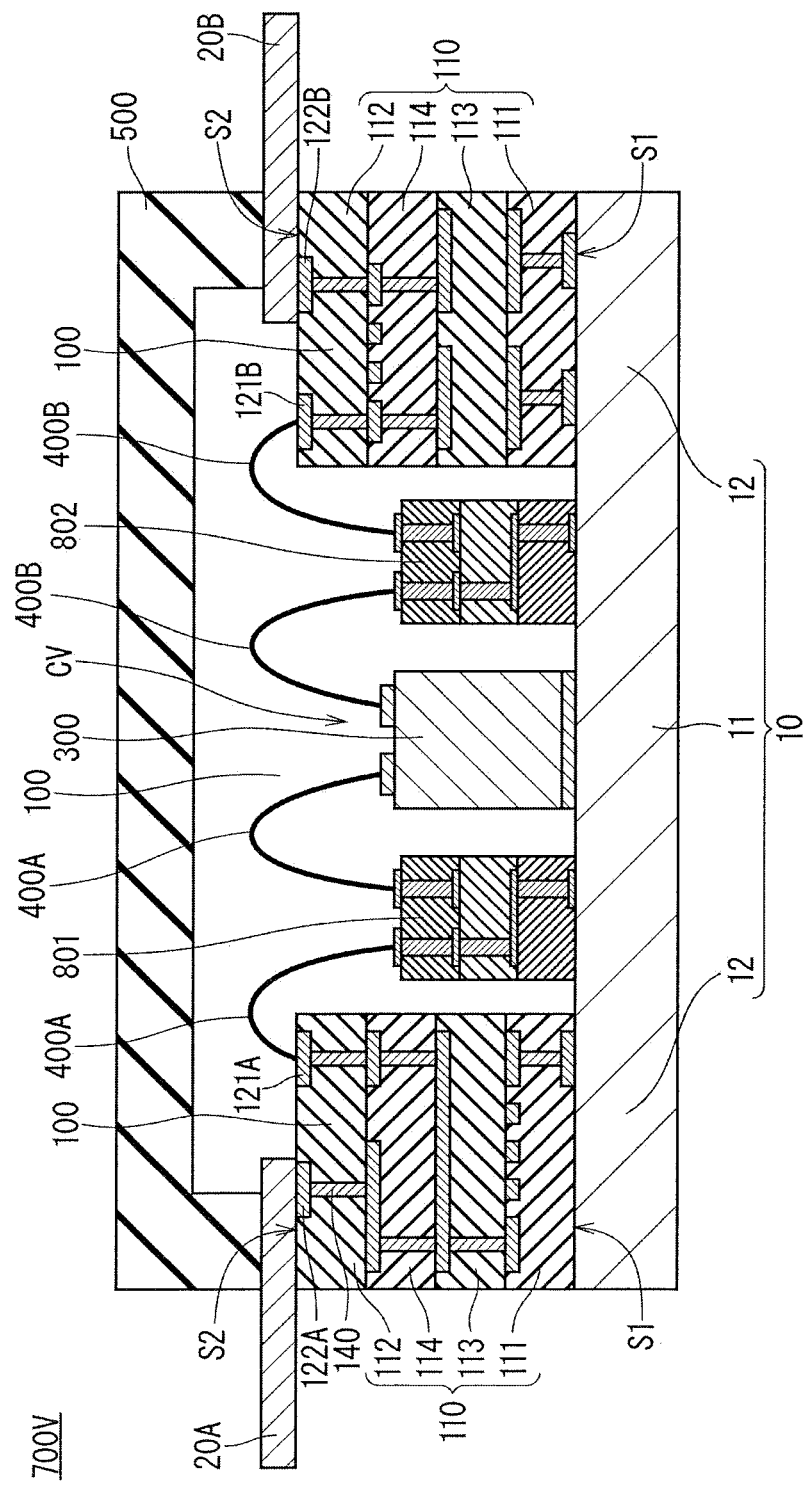
FIG. 4 is a cross-sectional view illustrating a configuration of a semiconductor device according to a modification.

Further, in the semiconductor device 700 according to the above embodiment, a matching circuit thereof is substantially configured by the frame 100. However, the matching circuit may be configured by the frame and another component. FIG. 4 is a cross-sectional view illustrating a semiconductor device 700V according to such a modification. As a difference from the semiconductor device 700, a dielectric element 801 configuring an input matching circuit together with the frame 100 and a dielectric element 802 configuring an output matching circuit together with the frame 100 are provided in the semiconductor device 700V. The element connector 121A of the frame 100 and the semiconductor element 300 are connected by wiring parts 400A, with the dielectric element 801 being interposed therebetween. Further, the element connector 121B of the frame 100 and the semiconductor element 300 are connected by wiring parts 400B, with the dielectric element 802 being interposed therebetween. The dielectric elements 801 and 802 may be mounted on the mounting area 11.

While the invention has been shown and described in detail, the foregoing description is in all aspects illustrative and not restrictive. It is therefore understood that numerous unillustrated modifications can be devised without departing from the scope of the invention.

EXPLANATION OF REFERENCE SIGNS

CV Cavity
S1 Frame lower surface (first surface)
S2 Frame upper surface (second surface)
10 Base substrate
11 Mounting area
12 Frame area
121A, 121B Element connector
20A, 20B Lead frame
100 Frame
100A Input matching circuit
100B Output matching circuit
110 Dielectric layer
122A, 122B Frame connector
130 Electrode layer
140 Via electrode
181, 183, 184 Capacitor
182, 185 Inductor
300 Semiconductor element
301 Semiconductor part
311 Back-surface electrode
312A, 312B Terminal
400A, 400B Wiring part
500 Lid
700 Semiconductor device

The invention claimed is:

1. A package comprising:
a base substrate being made of metal, and including a mounting area on which a semiconductor element is to be mounted and a frame area surrounding the mounting area;
a frame being provided on the frame area of the base substrate, and including a first surface facing the frame area and a second surface opposite to the first surface; and
a lead frame being joined to the second surface of the frame, wherein
the frame includes a plurality of dielectric layers having a layered structure and an element connector to be electrically connected to the semiconductor element, the element connector is apart from the lead frame, and the plurality of dielectric layers include a first dielectric layer having first permittivity and a second dielectric layer having second permittivity different from the first permittivity.

2. The package according to claim 1, wherein
the element connector of the frame is electrically isolated from the lead frame on the second surface.

3. The package according to claim 1, wherein
the frame includes at least one via electrode penetrating at least one of the plurality of dielectric layers.

4. The package according to claim 3, wherein
the at least one via electrode includes a via electrode connected to the element connector of the frame.

5. The package according to claim 3, wherein
the frame includes a frame connector connected to the lead frame, and
the at least one via electrode includes a via electrode connected to the frame connector.

6. The package according to claim 1, wherein
the frame includes at least one electrode layer interposed between the plurality of dielectric layers.

7. A semiconductor device comprising:
the package according to claim 1;
a semiconductor element being mounted on the mounting area of the base substrate of the package, and including a terminal; and
a wiring part connecting the element connector of the frame of the package and the terminal of the semiconductor element.

8. The semiconductor device according to claim 7, wherein
the terminal of the semiconductor element outputs an electric signal from the semiconductor element with characteristic impedance of 5 ohms or less, and the lead frame outputs the electric signal with characteristic impedance of 50 ohms.

* * * * *